(12) United States Patent
Livache et al.

(10) Patent No.: US 6,607,929 B1
(45) Date of Patent: Aug. 19, 2003

(54) DEVICE AND METHOD FOR TESTING SENSITIVE ELEMENTS ON AN ELECTRONIC CHIP

(75) Inventors: Thierry Livache, Janie (FR); Patrice Caillat, Echirolles (FR)

(73) Assignee: Commissariat a l' Energie Atomique, Paris (FR)

( * ) Notice: Subject to any disclaimer, the term of this patent is extended or adjusted under 35 U.S.C. 154(b) by 0 days.

(21) Appl. No.: 09/555,136
(22) PCT Filed: Dec. 23, 1998
(86) PCT No.: PCT/FR98/02849
§ 371 (c)(1),
(2), (4) Date: Jul. 10, 2000
(87) PCT Pub. No.: WO99/34227
PCT Pub. Date: Jul. 8, 1999

(30) Foreign Application Priority Data

Dec. 24, 1997 (FR) .............................. 97 16516

(51) Int. Cl.⁷ .......................... H01L 21/66; G01R 31/26
(52) U.S. Cl. ......................................... 438/17; 324/765
(58) Field of Search .................... 438/14, 17; 324/522, 324/523, 765

(56) References Cited

U.S. PATENT DOCUMENTS 4,743,954 A * 5/1988 Brown ....................... 257/253
6,110,339 A * 8/2000 Yager et al. ................. 204/451
6,254,827 B1 * 7/2001 Ackley et al. ................. 422/50

FOREIGN PATENT DOCUMENTS

WO WO94/22889 10/1994

OTHER PUBLICATIONS

Biofutur, "Un outil pour analyser plusieurs milliers de génes simultanément", *Le Technoscope de Biofutur 166*, Apr. 1997.

Gregory T. A. Kovacs, et al. "Silicon Micromachining—Sensors to Systems", *Analytical Chemistry News & Features, Jul. 1, 1996*.

* cited by examiner

*Primary Examiner*—Kamand Cuneo
*Assistant Examiner*—Evan Pert
(74) *Attorney, Agent, or Firm*—Thelen Reid & Priest LLP; Robert E. Krebs

(57) ABSTRACT

A method and device for testing an electronic chip (10) having on the surface a plurality of addressable electrically conductive sensitive elements (12) in which the sensitive elements on the chip are put in contact with a conductive solution (52), one or more sensitive elements (12) are addressed selectively in order to apply to each sensitive element addressed an electrical test signal referred to as an input signal, and a signal, referred to as the output signal, on an electrode (60, 60a) also in contact with the conductive solution, is measured.

13 Claims, 5 Drawing Sheets

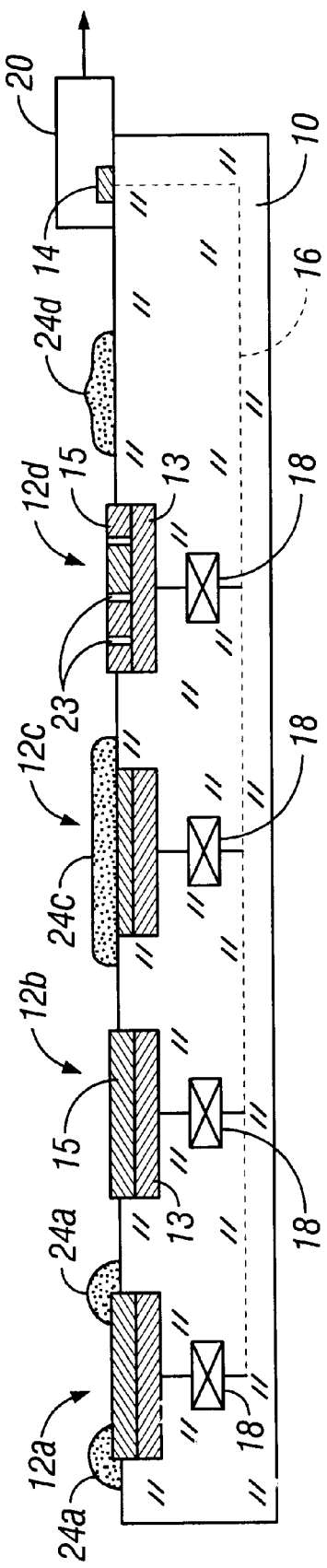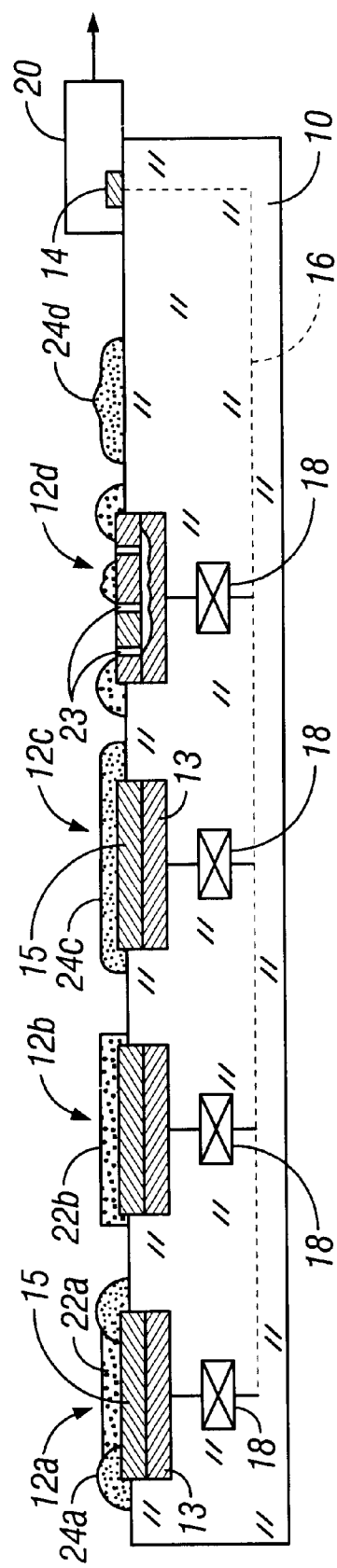
FIG. 1A (Prior Art)
FIG. 1B (Prior Art)

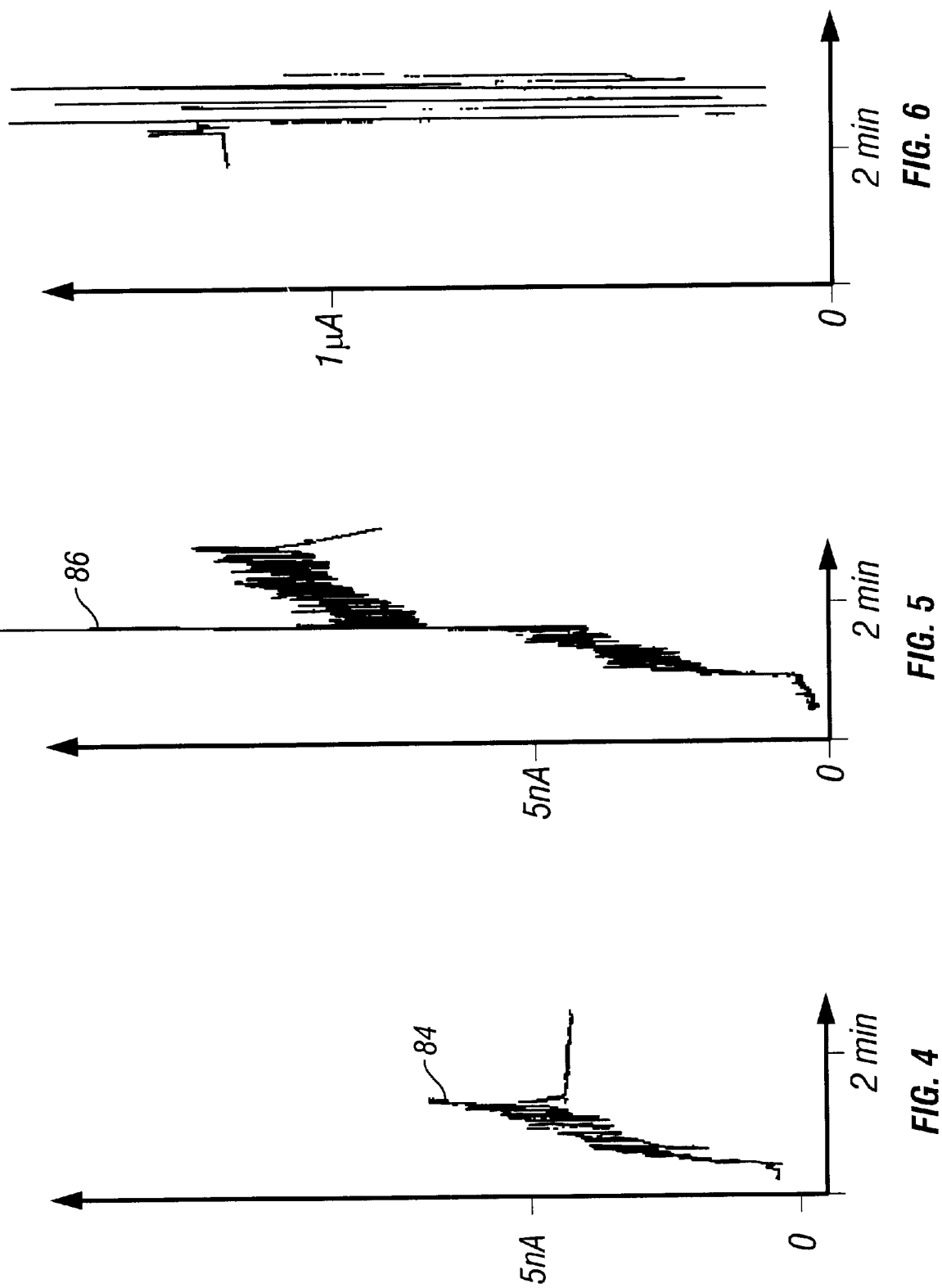

DEVICE AND METHOD FOR TESTING SENSITIVE ELEMENTS ON AN ELECTRONIC CHIP

TECHNICAL FIELD

The present invention relates to a device and method for testing sensitive elements of the surface of an electronic chip.

More and more electronic chips are being used as an analysis support and/or an information collector in the fields of biological or chemical analysis, or for measuring physical quantities. The electronic chips have for this purpose on their surface a plurality of sensors, receivers or microsystems, hereinafter referred to as "sensitive elements". The sensitive elements are, for example, electrodes which can be immersed in a fluid to be analyzed. These electrodes are then selectively covered with a lining layer sensitive to a given chemical or biological compound. In some cases, the chips can also have means for selectively addressing the sensitive elements in order to apply thereto an electrical potential or for making individual electrical measurements on these elements.

The present invention finds applications in particular in checking the correct functioning of electronic chips equipped with electrodes and in checking the quality of the sensitive lining layers which cover the electrodes.

PRIOR ART

The accompanying FIG. 1A is a schematic section of an electronic chip having electrodes.

The chip has a substrate 10 with a plurality of electrodes. For reasons of clarity only four electrodes are depicted in the figure, these electrodes bearing respectively the references 12a, 12b, 12c and 12d. A chip may, however, have a large number of electrodes. The electrodes have a bottom layer 13 made from a material such as titanium, for example, covered with a top layer 15 of a metal such as gold or platinum.

In order to confer on the electrodes their function of biological or chemical sensor, they are provided with a layer of reactive material or a material able to interact with the biological material. These materials may include electrically conductive polymers. By way of example, a modified polypyrrole can be used as a biologically sensitive layer.

All the electrodes can be covered with the same material or can be selectively covered with different materials sensitive to different compounds. By way of illustration of the use of chips equipped with electrodes, for the analysis of chemical or biological substances, reference can be made, for example, to documents (1) and (2) whose references are indicated at the end of the present description. Document (3), also referenced, relates more generally to the machining of silicon and the manufacture of sensors.

Returning to FIG. 1A, it can be seen that the electrodes 12 on the chip 10 are electrically connected to input/output terminals 14, only one of which is shown. The electrical connection is shown schematically by a dot and dash line 16.

Where the chip has a small number of electrodes, each electrode can be respectively connected to a particular input/output terminal associated with it.

However, as shown in FIG. 1A, the connection between the electrodes and the input/output terminals can also be effected by means of multiplexer circuits 18.

The multiplexer circuits enable addressing to take place from a small number of input/output terminals to several hundreds of electrodes on the surface of the chip.

In the sense of the present description, addressing means the putting of at least one electrode (or other sensitive element) in electrical connection with at least one input/output terminal. The addressing of an electrode makes it possible not only to apply a voltage or signal to it by means of one or more input/output terminals but also to make electrical measurements on this electrode.

To effect addressing, that is to say to select a certain number of electrodes, the input/output terminals are connected to external electronic control devices, not shown, for example by connection means 20, shown in outline.

In FIG. 1A, it can be seen that the top metal layer 15 of the electrode 12d has a porosity 23 able to allow a fluid to come into contact with the subjacent bottom layer 13 of the electrode.

Moreover, during the manufacture of the electrodes, residues of material may remain on the surface of the chip. For example, residues of lacquer used during operations of forming etching masks may remain.

Such residues, marked in FIG. 1A with the references 24a, 24c and 24d, may partly cover an electrode, which is the case with the electrode 12a, cover it completely, which is the case with the electrode 12c, or remain in a region with no electrodes, which is the case with the residue 24d.

As mentioned previously, the electrodes on a chip, intended for the analysis of biological or chemical environments, are covered with a layer of material which confers on them their sensitivity to a given chemical compound or biological substance.

The lining of the electrodes on the chip in FIG. 1A is illustrated by FIG. 1B. It can be seen that the electrode 12b in FIG. 1B is covered with a sensitive layer 22b, for example made of conductive polymer. The sensitive layer 22b covers the entire surface of the electrode. The sensitive layer can be formed by selective deposition methods or possibly electrochemically by selectively applying an appropriate electrolysis current to each electrode which is to be lined.

It can be seen, on the other hand, for the electrode 12a, that the material of the sensitive layer 22a covers only part of its surface not encumbered by the residue 24a. Thus the covering of the electrode 12a is not homogeneous.

For the electrode 12c, it can be seen that the residue 24c which covers the entire surface prevents the formation of a sensitive layer.

Finally, it is apparent that the electrode 12d in FIG. 1B has been partly destroyed during the lining step.

The bottom layer 13 of this electrode, by not being correctly protected by the top layer 15, because of the porosity 23, has undergone deterioration caused by the agents or fluids used for the lining of the electrodes. Thus the electrode 12d is unable to make analysis measurements.

Electrodes such as the electrode 12a or 12c which either have no sensitive layer or are equipped with a layer which only partially covers their surface, lead to erroneous analysis results.

Moreover, a residue such as the residue 24d, visible in FIGS. 1A and 1B, even if it does not directly interfere with the formation of a sensitive layer, risks interfering with the analysis measurements made on the adjacent electrodes.

All the probable faults mentioned above are liable to prevent the functioning or interfere with the functioning of a certain number of analysis electrodes on a chip.

Similar problems are posed also for chips equipped with other sensitive elements such as micromechanical elements, whose functioning may also be disturbed by residues of material or by defects caused during the manufacturing processes.

In the field of micro-electronics, a certain number of tests designed to check the correct functioning of electronic chips are known.

Amongst these tests there are notably conductimetry tests and visual tests.

Conductimetry tests consist essentially of moving movable conductive spikes on the surface of the chip in order to put them in contact with conductive elements on this chip and check the passage of a measuring current.

However, in an application to analysis chips, electrical tests with movable spikes do not make it possible to detect the electrodes which are certainly covered with a lining layer but for which the lining layer has a lack of homogeneity or porosities, or covers only part of the electrode, as in the case of the electrode 12a in FIG. 1B.

In addition, electrical tests with movable spikes offer a resolution which makes it difficult to use them for chips where the electrode pitch is less than 50 μm.

In addition, the movable test spikes moved on the surface of the chip risk locally breaking a layer of residue covering an electrode and locally coming into contact with the subjacent electrode. In this case, a measuring current may be detected and the electrode is considered to be functional whilst it remains essentially covered by the layer of residue. Thus an electrode such as the electrode 12c in FIG. 1 would be wrongly considered to be valid.

In the same way, the movement of the movable test spikes on the surface of a chip may mechanically damage the electrode coating layer. The test is then destructive.

Finally, it should be added that the electrical tests on the chips by means of movable spikes prove to be too lengthy and therefore unsuitable for checking chips having numerous electrodes.

Visual tests, carried out by microscopy, are valid only when the coating layers to be checked have a certain thickness. When the electrode coating layer is formed by a very fine deposit, such as a monomolecular layer or a layer formed by adsorption of material on the electrodes, visual test methods prove unsatisfactory and unsuitable. This is the case notably for chips having analysis electrodes.

Finally, the usual known tests in the field of microelectronics prove unsuitable for checking analysis chips as described previously. In particular, these tests do not make it possible to correctly evaluate, qualitatively and quantitatively, the functioning of the electrodes.

DISCLOSURE OF THE INVENTION

The purpose of the present invention is to propose a test method for checking the correct functioning of a chip having sensitive elements, by means of a qualitative and quantitative check on the functioning of each sensitive element on the chip.

Another aim is to propose a test method not presenting the difficulties or limitations indicated above.

One aim is in particular to propose such a method able to be applied systematically to chips having addressable electrodes.

Another aim is to propose such a method which can be implemented before or after the formation of functional coatings on the electrodes and which allows not only the checking of the electrode addressing system but also, where applicable, the quality and homogeneity of the coating layers on them.

Another aim of the invention is to propose an inexpensive and non-destructive test method making it possible to automatically and individually test, if necessary, all the sensitive elements.

One aim of the invention is also to propose a simple and inexpensive test device intended for implementing the test method.

To achieve these aims, the object of the invention is more precisely a method of testing an electronic chip having on the surface a plurality of addressable conductive sensitive elements, in which the sensitive elements on the chip are put in contact with a conductive solution, in which one or more sensitive elements are selectively addressed in order to apply to each sensitive element addressed an electrical test signal referred to as the input signal, and a signal, referred to as the output signal, for example on a counter-electrode in contact with the conductive solution, is measured.

The conductive solution is, for example, an aqueous or organic solution sufficiently conductive to allow a measurable current to pass, and which will attack the substrate to be tested as little as possible, both during the electrochemical activation and at rest. It is possible to use, for example, water or a mixture of solvents optionally with substances such as salts added, reducing its electrical resistance.

Advantageously, the conductive solution can be a liquid identical or similar to a liquid which is subsequently to be analyzed or used for analysis.

By virtue of the method of the invention, no mechanical contact with the chip is necessary, and thus the risk of damage to the sensitive elements is removed. In addition, the method can be implemented automatically and rapidly even when the chip tested has a large number of electrodes.

According to a particular aspect of the invention, it is possible to test the sensitive elements, for example electrodes, either collectively or successively and individually.

By way of example, it is possible to carry out successive tests relating to a set of sensitive elements addressed, to which a sensitive element supplementary to each test is respectively added.

It is also possible to perform a test relating simultaneously to a plurality of sensitive elements on the chip or to all the sensitive elements on the chip.

According to a particular implementation of the method, the electrical test signal can simply be an electrical potential. Electrical potential means a difference in potential measured for example with respect to the counter-electrode.

When an electrical potential is applied to an electrode or to a sensitive (conductive) element, an electrical current is generated through the conductive solution as far as the counter-electrode. This measured current then constitutes an output signal. In the same way, when a potential is applied to several electrodes, the output signal comprises the sum of the currents generated in the conductive solution from each electrode addressed.

Optionally, the electrical potential applied to the electrodes can be adjusted with respect to a reference electrode also in contact with the conductive solution.

Another object of the invention is a device for testing addressable sensitive elements, such as the electrodes on an electronic chip. The device has:

- an electrochemical cell containing a conductive solution, able to receive the addressable sensitive elements on the electronic chip,
- means for selectively addressing at least one sensitive element and for applying thereto at least one signal, referred to as the input signal,
- means, connected to at least one electrode in contact with the conductive solution, for measuring at least one signal, referred to as the output signal, in response to the input signal applied to at least one sensitive element on the electronic chip.

In the case where the chip has a plurality of electrodes, one or more of these electrodes can be used for measuring the output signal. A particular electrode, independent of the chip, can also be put in contact with the conductive solution in order to measure the output signal. In the remainder of the text, the electrode used for closing the circuit is designated as the counter-electrode.

The electrochemical cell can be formed by any device for putting the sensitive elements on the chip and the counter-electrode in contact with a conductive solution.

According to a particular embodiment, the electrochemical cell can include a vessel containing the conductive solution.

The counter-electrode can be separate from the chip and immersed in the conductive solution. It can also be formed directly on the chip and be put in contact with the conductive solution at the same time as the electrodes on the chip.

The means for selectively addressing the sensitive elements and applying an input signal thereto can include a power supply, capable of delivering a potential, and a system for addressing the electrodes for applying the said potential to one or more selected electrodes.

Other characteristics and advantages of the present invention will emerge more clearly from the following description, with reference to the figures in the accompanying drawings. This description is given purely as an illustration and non-limitatively.

In particular, the description which follows refers explicitly to the particular case in which the sensitive elements on the chip are electrodes for analysing chemical or biological substances.

To measure the output signal, the device can have a system for measuring a current generated in the electrochemical cell which passes through the counter-electrode, as a function of the number of sensitive elements addressed.

However, the invention is not limited to this application. This is because other more complex sensitive elements such as mechanical microsystems, accelerators or more generally elements having at least one addressable conductive armature, can be tested like the simple conductive electrodes.

BRIEF DESCRIPTION OF THE FIGURES

FIG. 1A, already described, is a schematic section of an electronic chip having addressable conductive electrodes.

FIG. 1B, already described, is a schematic section of the electronic chip of FIG. 1A after an electrode lining operation.

FIGS. 4, 5 and 6 are graphs depicting the appearance of an output signal of the device of FIG. 2 during tests on partially or completely defective chips.

DETAILED DESCRIPTION OF EMBODIMENTS OF THE INVENTION

Figure 2:
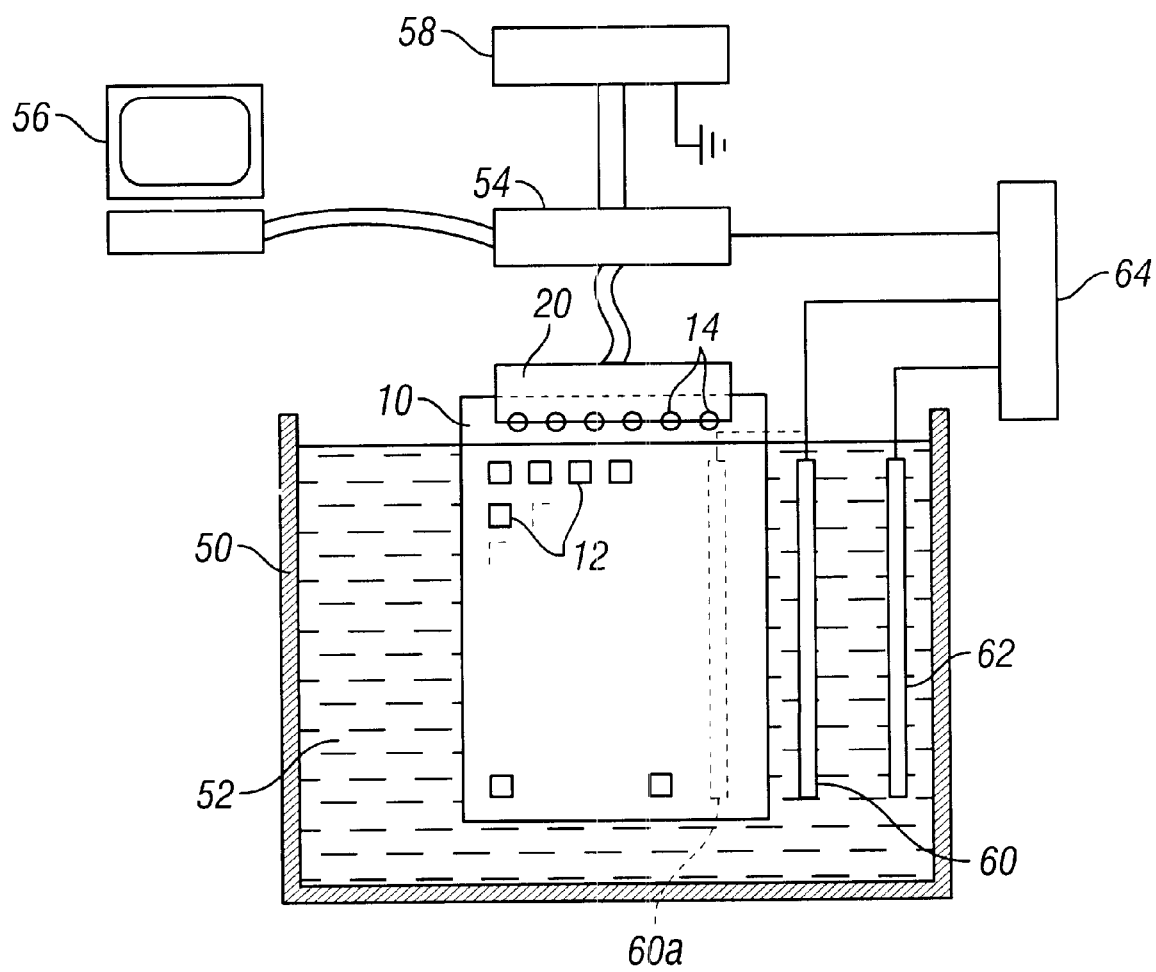
FIG. 2 is a schematic representation of a test device in accordance with the invention.

FIG. 2 shows a test device in accordance with the invention.

The device has a vessel 50 containing a conductive solution 52. In the particular example described, the conductive solution is a decimolar solution of $LiClO_4$. The conductive solution can be chosen, for example, according to the chips to be tested and notably according to the biological or chemical environment in which the chips are subsequently to be used.

For particularly fragile chips, the conductive solution can be water with a substantially neutral pH, made conductive by adding a salt for example.

A chip 10, having electrodes 12, is introduced into the vessel so that the conductive solution covers the part of the chip including the electrodes.

The input/output terminals 14 of the chip are connected to an addressing module 54 by means of a connector 20.

The addressing module 54, controlled by a microcomputer 56, makes it possible, by applying a selection signal to the input/output terminals, to select one or more electrodes on the chip in order to put them in electrical connection with an input signal generator.

In the example described, the input signal generator is simply a constant voltage source 58 capable of applying a potential, for example 0.6 volts, to the selected electrodes.

The potential applied to the selected electrodes can be understood, for example, as a potential difference between the electrodes and a counter-electrode 60 also immersed in the conductive solution 52.

The counter-electrode 60 can be a platinum wire.

According to a variant, shown in dot and dash lines, the counter-electrode can also be a metallic area 60a formed directly on the chip 10.

The potential of the input signal can also be adjusted with respect to a reference electrode 62, for example a saturated calomel electrode, which is also in contact with the conductive solution.

An output signal from the test device reflects, for example, an electrical current passing through the conductive solution. This current is measured on the counter-electrode.

Measuring means 64, comprising for example a potentiostat, are connected to the counter-electrode, possibly to the reference electrode and to the addressing module, in order to take account of the voltage applied to the electrodes. These means make it possible thus to record the current in the counter-electrode according to the electrodes addressed. The current in the counter-electrode can be recorded, for example, by a plotter.

To test a chip, it is possible, for example, to successively and individually address the electrodes one after the other by applying to each electrode addressed the voltage delivered by the voltage source.

In this case, for each electrode the electrical current generated is measured and it is checked whether this current is situated in a predetermined range. When the current measured is less than the values of the range it can be considered, for example, that the surface of the electrode is not homogeneous or that it is partially or completely covered with a residue. A current greater than the values in the range may represent a baring of the subjacent material of the electrode situated under the coating layer.

The test on the chip can also be a so-called cumulative test. The potential of the voltage source is first of all applied in a first step to a single addressed electrode. At each following step an additional electrode is addressed in order to end up by applying the voltage potential to all the electrodes.

At each step the electrical current passing through the counter-electrode is measured. This current corresponds to the sum of the currents generated from each of the electrodes.

FIGS. 3 to 6 show recordings of the output signal measured in a test of the cumulative type for different electronic chips. These figures are graphs indicating on the Y-axis the total current passing through the counter-electrode, and on the X-axis a period of time. For reasons of clarity, the graph in FIG. 3 has an intentionally expanded time scale.

The recordings in FIGS. 3 to 6 correspond to the testing of chips comprising a matrix of 128 electrodes addressed successively and cumulatively over time, each with a potential of 0.6 volts.

Figure 3:
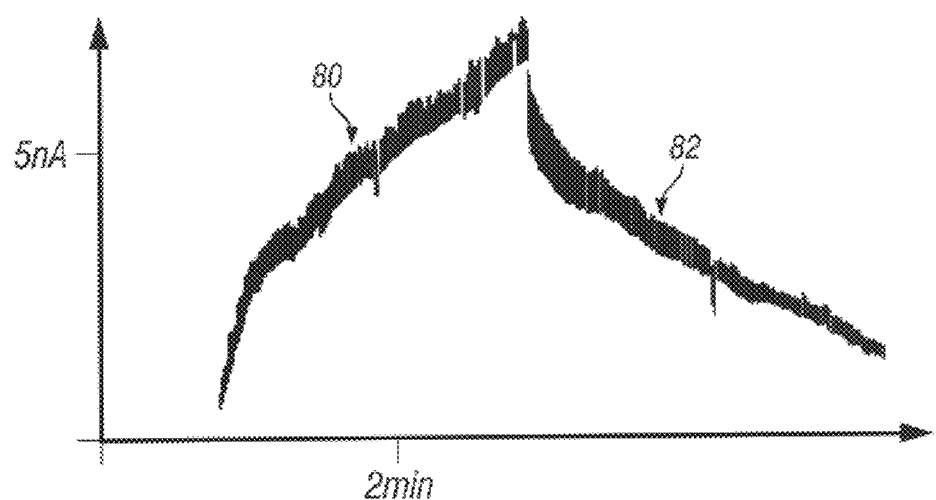
FIG. 3 is a graph showing the appearance of an output signal supplied by the device in FIG. 2 during a test on a correctly functioning chip.

In FIG. 3, two phases can be seen. During a first phase 80, an ever increasing number of electrodes is addressed until the 128 electrodes are raised to the test potential. In this phase, the current measured increases for each new electrode addressed.

During a second phase 82, electrodes are successively withdrawn from the group of electrodes being addressed. The output current measured decreases for each electrode removed.

FIG. 3 illustrates a favourable case in which all the electrodes are functional and where the chip is therefore valid. This is because the graph shows a regular incrementing (or respectively decrementing) of the current during each step of connecting (or disconnecting) an additional electrode at the test potential. In addition, the total current remains low, around 6 nA.

It is concluded from this not only that the addressing of the electrodes is correct, which represents a correct functioning of the multiplexing circuit, but also that the electrode lining coating is homogeneous and without defect.

The graph in FIG. 4 is obtained with a chip partially covered with a deposit. The test takes place normally until the $64^{th}$ electrode (out of 128), marked with the reference 84. As from there the current of the output signal measured stabilizes and no further additional current is visible.

The tested chip used for establishing this graph is covered over half of its surface with a layer of lacquer used for the conditioning of the chip.

Only 50% of the electrodes on the chip are usable.

The graph in FIG. 5 is obtained with a chip having a few defective electrodes.

The addressing and test take place normally up to the $51^{st}$ electrode. The current increments are in fact regular and the total current is less than 5 nA.

A current peak 86 coincides with the addressing of the $51^{st}$ and $52^{nd}$ electrodes. For these defective electrodes, the output current is greater than 100 nA.

The current peak 86 of the output signal represents a mechanical destruction of the (gold) surface of the electrodes concerned.

After a disconnection of these electrodes the output signal resumes a normal appearance.

The graph in FIG. 6 is obtained with a chip having a defect of the electrochemical type.

It can be seen that the output signal corresponds to very high currents, around 1 $\mu$A or more, compared with the currents in the previous curves. It is impossible to follow the addressing on the graph.

The chip used for carrying out this experiment was previously tested by traditional techniques in order to ensure the correct functioning of its addressing system.

Thus the high currents measured represent an incompatibility of the electrode coating with the conductive solution used.

The (gold) layers covering the electrodes are not "impervious" and oxidation reduction reactions of the subjacent materials lead to a destruction of the chip.

When the tests are complete and correct functioning of the chip is verified, the chip is extracted from the conductive solution, rinsed in distilled water and then dried.

Figure 7:
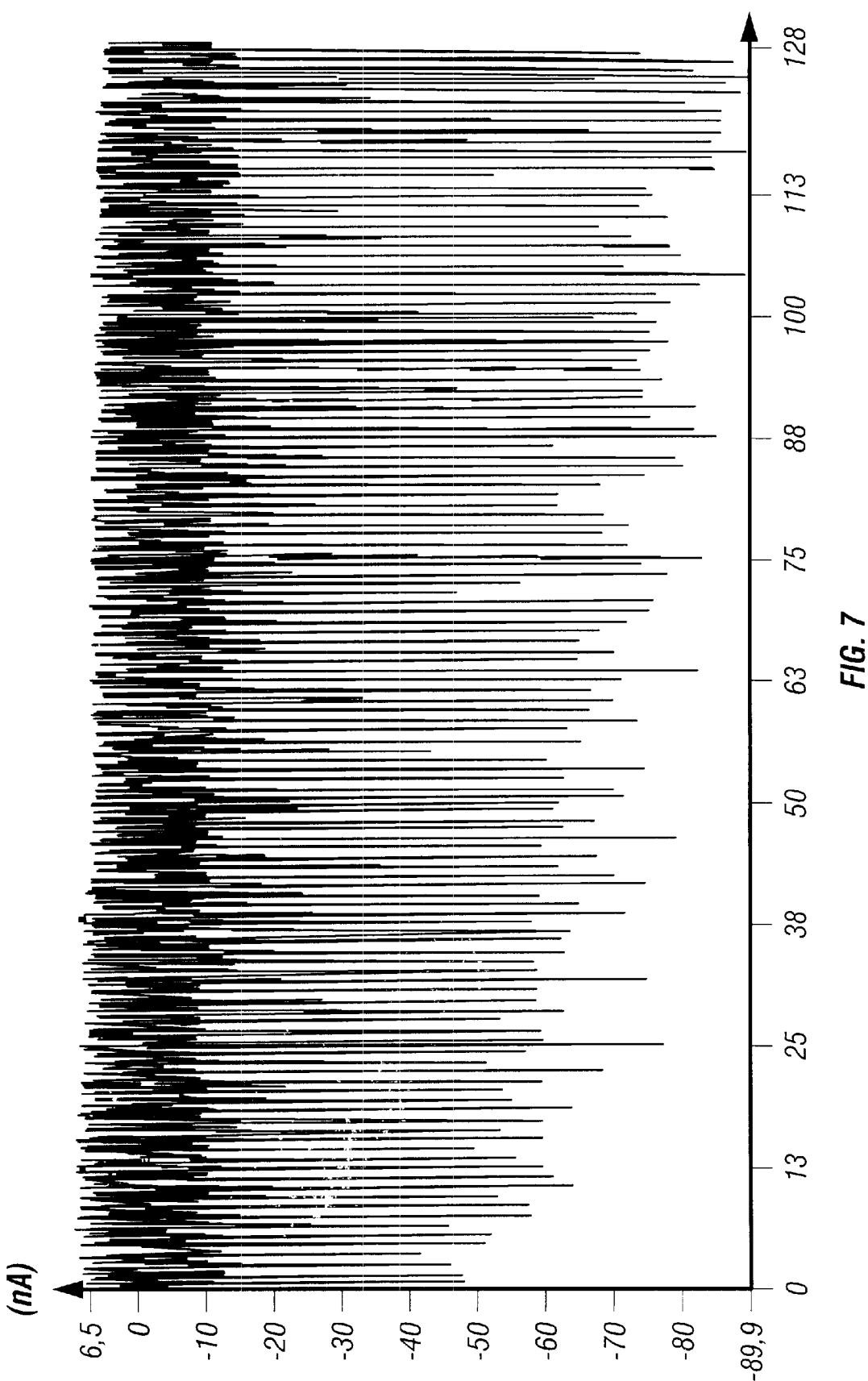
FIG. 7 is a graph showing the appearance of the output signal obtained during a non-cumulative test on a chip with 128 electrodes.

FIG. 7 is a recording carried out under the same test conditions as those described above. However, the test, carried out on a chip carrying 128 electrodes, is a non-cumulative test.

The graph indicates on the X-axis the serial numbers of the electrodes successively addressed, and on the Y-axis the corresponding current passing through the conductive solution. The current is expressed in nA and it is considered, in the example described, that a value of the current of between −10 and −100 nA corresponds to a usable electrode.

DOCUMENTS CITED (1) Biofutur N° 166, April 1997, Book 91, by Jérôme Hinfray.
(2) WO-A-94 22889 (Oct. 13, 1994).
(3) "Silicon Micromachining—Sensors to Systems" by G. T. A. Kovacs et coll., Analytical Chemistry News & Features, Jul. 1, 1996, pages 407–412.

What is claimed is:

1. A method for testing an electronic chip (10) having a plurality of conductive and electrically addressable sensitive elements (12) intended to be tested within a conductive solution, the method comprising:
   placing the sensitive elements (12) in contact with the conductive solution (52);
   selectively addressing at least one of the sensitive elements (12) and applying an electrical test signal to address one of the sensitive elements (12);
   placing at least one electrode (60, 60a) in contact with the conductive solution (52);
   measuring an output-signal at the electrode (60, 60a); and
   determining the operational characteristics of the addressed one of the sensitive elements (12) from the output signal,
   wherein said sensitive elements (12) are in an unfinished state.

2. The method of claim 1, wherein said addressing further includes sequentially addressing each individual one of said sensitive elements.

3. The method of claim 1, wherein said addressing further includes sequentially addressing each subsequent one of said sensitive elements (12) and applying the electrical test signal to each addressed one of said sensitive elements (12).

4. The method of claim 1, wherein said conductive solution (52) is substantially similar to a liquid subsequently under test.

5. The method of claim 1, wherein said conductive solution (52) is dissimilar to a liquid subsequently under test.

6. The method of claim 1, wherein said electrical test signal is an electrical potential.

7. The method of claim 6, wherein said electrical potential is adjusted with respect to a reference electrode (62) in contact with the conductive solution (52).

8. A device for testing an electronic chip (10) with a plurality of addressable unfinished sensitive elements intended to be tested within a conductive solution, the device comprising:

an electrochemical cell (50) having the conductive solution (52), wherein said electrochemical cell receives the addressable unfinished sensitive elements (12) on the electronic chip (10);

means for selectively addressing at least one of the unfinished sensitive elements (12) from the output signal and for applying to said at least one of the unfinished sensitive elements (12) at least one input signal;

at least one electrode (60, 60*a*) in contact with the conductive solution (52); and means for detecting an output signal at the electrode (60, 60*a*), the operational characteristics of the addressed one of the unfinished sensitive elements (12) being determined from the output signal.

9. The device of claim 8, wherein the unfinished sensitive elements (12) are electrodes.

10. The device of claim 8, wherein the electrode (60) is a platinum wire.

11. The device of claim 8, wherein the electrode (60*a*) is provided on the electronic chip.

12. The device of claim 8, wherein said means for selectively addressing at least one of the unfinished sensitive elements (12) from the output signal and for applying to said at least one of the unfinished sensitive elements (12) at least one input signal includes a power supply (58) capable of delivering a voltage and a system (54) for addressing the unfinished sensitive elements (12) in order to apply said voltage to at least one of said selected unfinished sensitive elements (12).

13. The device of claim 8, wherein said means for measuring an output signal at the electrode (60, 60*a*) measures a current generated in the electrochemical cell corresponding to a number of unfinished sensitive elements (12) addressed.

* * * * *